(12) United States Patent
Hikichi et al.

(10) Patent No.: US 8,305,075 B2
(45) Date of Patent: Nov. 6, 2012

(54) MAGNETIC SENSOR CIRCUIT

(75) Inventors: Tomoki Hikichi, Chiba (JP); Minoru Ariyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 260 days.

(21) Appl. No.: 12/891,286

(22) Filed: Sep. 27, 2010

(65) Prior Publication Data
US 2011/0074404 A1 Mar. 31, 2011

(30) Foreign Application Priority Data
Sep. 29, 2009 (JP) ................. 2009-225469

(51) Int. Cl.
*G01R 33/07* (2006.01)
(52) U.S. Cl. .................... 324/251; 324/207.2
(58) Field of Classification Search .............. 324/207.2, 324/251
See application file for complete search history.

(56) References Cited

U.S. PATENT DOCUMENTS 5,552,682 A * 9/1996 Ushikoshi ............... 318/400.38
7,750,628 B2 * 7/2010 Rengachari .................. 324/252

FOREIGN PATENT DOCUMENTS

JP 2005-260629 A 9/2005
* cited by examiner

*Primary Examiner* — Bot Ledynh
(74) *Attorney, Agent, or Firm* — Brinks Hofer Gilson & Lione

(57) ABSTRACT

Provided is a magnetic sensor circuit of low power consumption, in which a magnetic detection level less depends on a resistance value of an internal resistor of a power source. A comparator circuit compares a voltage which is based on a magnetic field and generated after sampling under a state in which power is supplied to mainly a Hall element and an amplifier circuit to drop a power supply voltage, with a reference voltage after sampling under the same state. Both the voltages are generated based on the power supply voltage dropped by an internal resistor. Therefore, the magnetic detection level less depends on a resistance value of the internal resistor. The comparator circuit may be disabled during a sample period, and the Hall element and the amplifier circuit may be disabled during a comparison period, and hence power consumption of the magnetic sensor circuit is reduced by corresponding power.

3 Claims, 7 Drawing Sheets

MAGNETIC SENSOR CIRCUIT

RELATED APPLICATIONS

This application claims priority under 35 U.S.C. §119 to Japanese Patent Application No. 2009-225469 filed on Sep. 29, 2009, the entire content of which is hereby incorporated by reference.

BACKGROUND OF THE INVENTION

1. Technical Field

The present invention relates to a magnetic sensor circuit to be connected to a power source having an internal resistor.

2. Background Art

A conventional magnetic sensor circuit is described. FIG. 7 illustrates the conventional magnetic sensor circuit.

In the conventional magnetic sensor circuit, a Hall voltage is generated in a Hall element 61 by a magnetic field applied to the Hall element 61. The Hall voltage is amplified by an amplifier circuit 62. A reference voltage circuit 63 generates a reference voltage Vref. A comparator circuit 64 compares an amplified Hall voltage Vh with the reference voltage Vref. In this case, for example, when the amplified Hall voltage Vh is higher than the reference voltage Vref, an output voltage VOUT is in a high level, whereas when the amplified Hall voltage Vh is lower than the reference voltage Vref, the output voltage VOUT is in a low level (see, for example, Japanese Patent Application Laid-Open No. 2005-260629 (FIG. 5)).

Patent Document 1: JP2005-260629 (FIG. 5)

Incidentally, in seeking a magnetic sensor circuit having low power consumption, there is available a technology as illustrated in FIG. 1 in Japanese Patent Application Laid-open No. 2005-260629 to provide a sample and hold circuit (not shown) at a subsequent stage of the amplifier circuit 62. In this case, the amplified Hall voltage Vh is sampled by the sample and hold circuit during a sample period. During a subsequent comparison period, the sampled voltage Vh is compared with the reference voltage Vref by the comparator circuit 64. The magnetic sensor circuit is controlled to stop the power supply to the Hall element 61 and the amplifier circuit 62 during the comparison period, to thereby reduce the power consumption of the magnetic sensor circuit correspondingly.

A power source 50 includes an internal resistor 51 and an internal power source 52. A power supply voltage VDD of the magnetic sensor circuit drops from an internal power supply voltage VDDPS of the internal power source 52 to a voltage (VDDPS−Rvdd·Idd) based on a resistance value Rvdd of the internal resistor 51 and a current value Idd of current consumption of the magnetic sensor circuit which is caused by mainly the Hall element 61 and the amplifier circuit 62.

In the technology described above, during the sample period, power is supplied to mainly the Hall element 61 and the amplifier circuit 62 to drop the power supply voltage VDD. However, during the comparison period, power is not supplied to the Hall element 61 and the amplifier circuit 62, and hence the power supply voltage VDD hardly drops. Therefore, the comparator circuit 64 compares the voltage Vh sampled under the drop of the power supply voltage VDD with the reference voltage Vref determined in the state in which the power supply voltage VDD hardly drops.

In this case, when a magnetoelectric conversion coefficient of the Hall element 61 is denoted by KH, the following Expressions (21) to (23) hold.

$$VDD = VDDPS - Rvdd \cdot Idd \quad (21)$$

$$KH \propto VDD \quad (22)$$

$$Vref \propto VDDPS \quad (23)$$

From Expression (22), Expression (24) also holds.

$$Vh \propto VDD \quad (24)$$

A magnetic detection level Bdet on the detection of a magnetic field applied to the Hall element 61 is expressed by the following Expression (25).

$$Bdet = Vref/KH \quad (25)$$

Therefore, from Expressions (22) to (25), the magnetoelectric conversion coefficient KH is proportional to the dropped power supply voltage VDD, and hence the voltage Vh based on the magnetic field is also proportional to the dropped power supply voltage VDD. In contrast, the reference voltage Vref is proportional to the power supply voltage VDD (internal power supply voltage VDDPS) which hardly drops, and hence the magnetic detection level Bdet depends on the resistance value Rvdd of the internal resistor 51.

SUMMARY OF THE INVENTION

The present invention has been made in view of the problem described above. An object of the present invention is to provide a magnetic sensor circuit of low power consumption, in which a magnetic detection level less depends on a resistance value of an internal resistor of a power source.

In order to solve the above-mentioned problem, the present invention provides a magnetic sensor circuit to be connected to a power source having an internal resistor, including: a Hall element for generating a Hall voltage based on a magnetic field; an amplifier circuit for amplifying the Hall voltage; a reference voltage circuit for generating a reference voltage; a sample and hold circuit for sampling the amplified Hall voltage and a voltage based on the reference voltage during a sample period; a comparator circuit for comparing the sampled and amplified Hall voltage with the sampled voltage based on the reference voltage during a comparison period and generating an output voltage based on a comparison result; and a control circuit for controlling at least the Hall element and the amplifier circuit to an active state during the sample period and controlling at least the comparator circuit to an active state during the comparison period.

In the present invention, the comparator circuit compares the amplified Hall voltage that is sampled under a state in which power is supplied to mainly the Hall element and the amplifier circuit to drop a power supply voltage, with the voltage based on the reference voltage that is sampled under the same state. Both the voltages are generated based on the power supply voltage dropped by the internal resistor. Therefore, a magnetic detection level less depends on a resistance value of the internal resistor.

For example, the comparator circuit may be disabled during the sample period, and the Hall element and the amplifier circuit may be disabled during the comparison period, and hence the power consumption of the magnetic sensor circuit is reduced by corresponding power.

DETAILED DESCRIPTION OF THE PREFERRED EMBODIMENTS

Hereinafter, embodiments of the present invention are described with reference to the attached drawings.

First Embodiment

Figure 1:
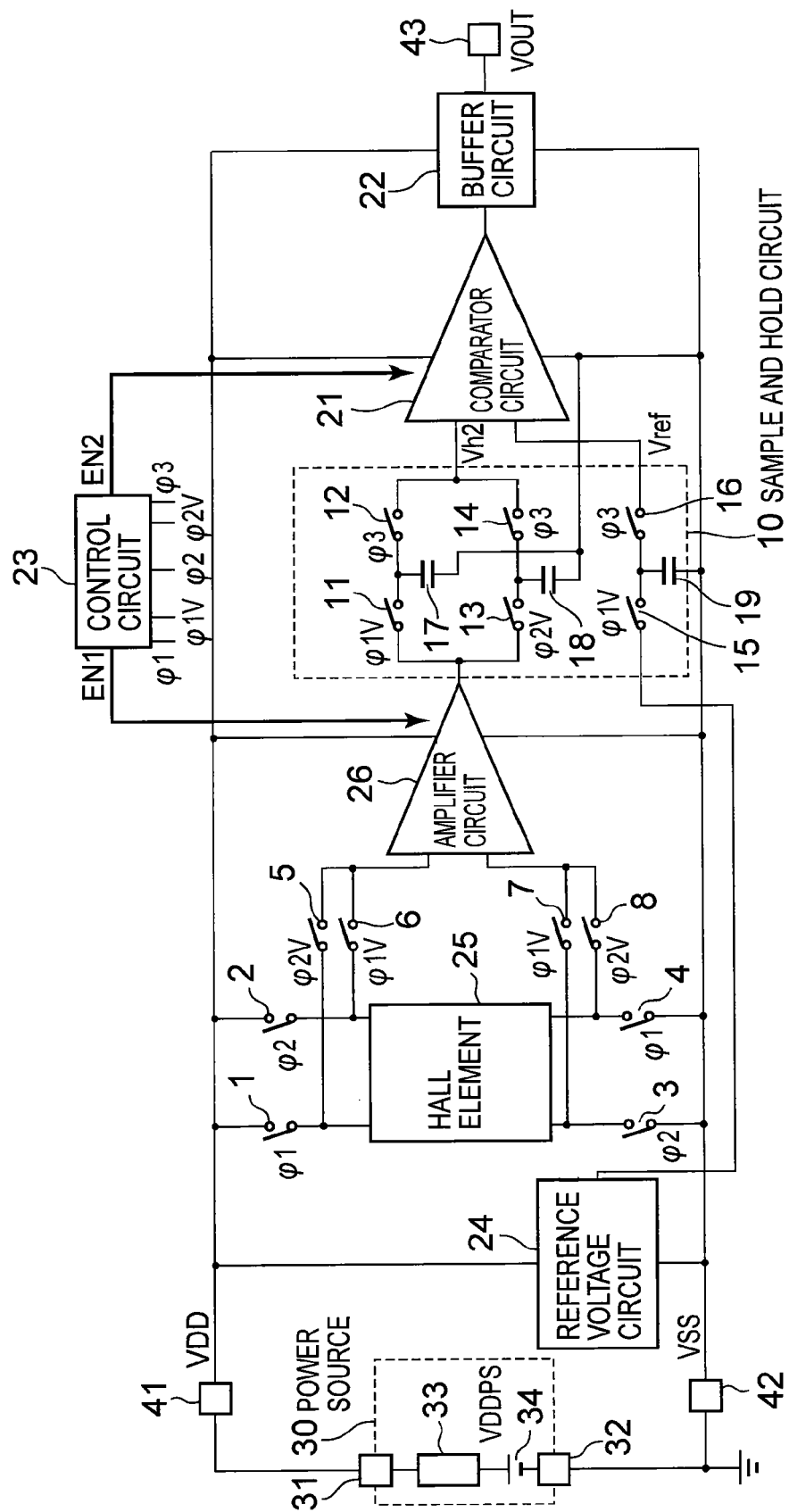
FIG. 1 illustrates a magnetic sensor circuit according to a first embodiment of the present invention.
Figure 2:
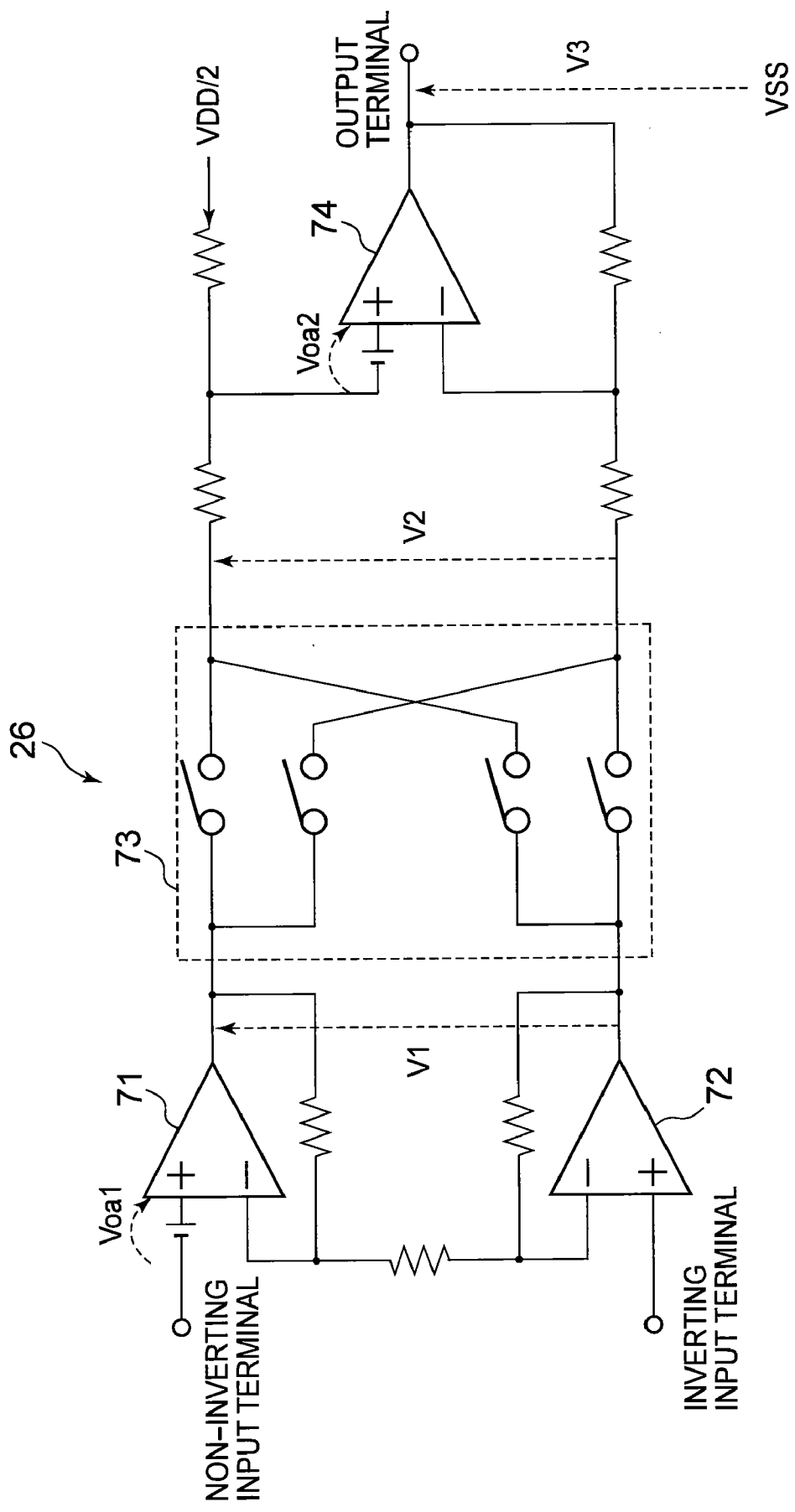
FIG. 2 illustrates an amplifier circuit of the magnetic sensor circuit according to the first embodiment of the present invention.

A structure of a magnetic sensor circuit according to a first embodiment is described. FIG. 1 illustrates the magnetic sensor circuit according to the first embodiment. FIG. 2 illustrates an amplifier circuit of the magnetic sensor circuit according to the first embodiment.

The magnetic sensor circuit includes a reference voltage circuit 24, a Hall element 25, switches 1 to 8, an amplifier circuit 26, a sample and hold circuit 10, a comparator circuit 21, a buffer circuit 22, and a control circuit 23. The magnetic sensor circuit further includes a power supply terminal 41, a ground terminal 42, and an output terminal 43. The sample and hold circuit 10 includes switches 11 to 16 and capacitors 17 to 19. Although not illustrated, the sample and hold circuit 10 further includes first and second input terminals and first and second output terminals. A power source 30 to be connected to the magnetic sensor circuit includes an internal resistor 33 and an internal power source 34. The power source 30 further includes a power supply terminal 31 and a ground terminal 32. As illustrated in FIG. 2, the amplifier circuit 26 includes a first-stage first amplifier 71, a first-stage second amplifier 72, a chopper circuit 73, and a second-stage amplifier 74. The amplifier circuit 26 further includes a non-inverting input terminal, an inverting input terminal, and an output terminal.

The Hall element 25 includes a first terminal connected to the power supply terminal 41 through the switch 1, a second terminal connected to the power supply terminal 41 through the switch 2, a third terminal connected to the ground terminal 42 through the switch 3, and a fourth terminal connected to the ground terminal 42 through the switch 4.

The switch 5 is provided between the first terminal of the Hall element 25 and the non-inverting input terminal of the amplifier circuit 26. The switch 6 is provided between the second terminal of the Hall element 25 and the non-inverting input terminal of the amplifier circuit 26. The switch 7 is provided between the third terminal of the Hall element 25 and the inverting input terminal of the amplifier circuit 26. The switch 8 is provided between the fourth terminal of the Hall element 25 and the inverting input terminal of the amplifier circuit 26.

The sample and hold circuit 10 includes the first input terminal connected to the output terminal of the amplifier circuit 26, the second input terminal connected to an output terminal of the reference voltage circuit 24, the first output terminal connected to a non-inverting input terminal of the comparator circuit 21, and the second output terminal connected to an inverting input terminal of the comparator circuit 21. In the sample and hold circuit 10, the switches 11 and 12 are connected in series in this order between the first input terminal and the first output terminal, the switches 13 and 14 are connected in series in this order between the first input terminal and the first output terminal, and the switches 15 and 16 are connected in series in this order between the second input terminal and the second output terminal. The capacitor 17 is provided between the ground terminal 42 and a connection point between the switches 11 and 12. The capacitor 18 is provided between the ground terminal 42 and a connection point between the switches 13 and 14. The capacitor 19 is provided between the ground terminal 42 and a connection point between the switches 15 and 16.

The reference voltage circuit 24, the amplifier circuit 26, the comparator circuit 21, and the buffer circuit 22 are each provided between the power supply terminal 41 and the ground terminal 42. The buffer circuit 22 includes an input terminal connected to an output terminal of the comparator circuit 21 and an output terminal connected to the output terminal 43. The control circuit 23 outputs signals EN1 and EN2, signals $\Phi 1$, $\Phi 2$, and $\Phi 3$, and signals $\Phi 1V$ and $\Phi 2V$ to control the amplifier circuit 26, the comparator circuit 21, the switches 1 to 8, and the switches 11 to 16.

The power supply terminal 31 is connected to the power supply terminal 41. The ground terminal 32 is connected to the ground terminal 42. The internal resistor 33 and the internal power source 34 are connected in series in this order between the power supply terminal 31 and the ground terminal 32.

As illustrated in FIG. 2, in the amplifier circuit 26, an output voltage generated by a first amplification stage unit including the first-stage first amplifier 71 and the first-stage second amplifier 72 is input to a second amplification stage unit including the second-stage amplifier 74 through the chopper circuit 73.

The Hall element 25 generates a Hall voltage based on a magnetic field. The amplifier circuit 26 amplifies the Hall voltage. The reference voltage circuit 24 generates a reference voltage Vref. The sample and hold circuit 10 samples the amplified Hall voltage and the reference voltage Vref during a sample period. The comparator circuit 21 compares the sampled and amplified Hall voltage with the sampled reference voltage Vref during a comparison period and outputs an output voltage based on a result obtained by comparison. The control circuit 23 controls the comparator circuit 21 to an inactive state during the sample period, and controls the Hall element 25 and the amplifier circuit 26 to an inactive state during the comparison period.

Figure 3:
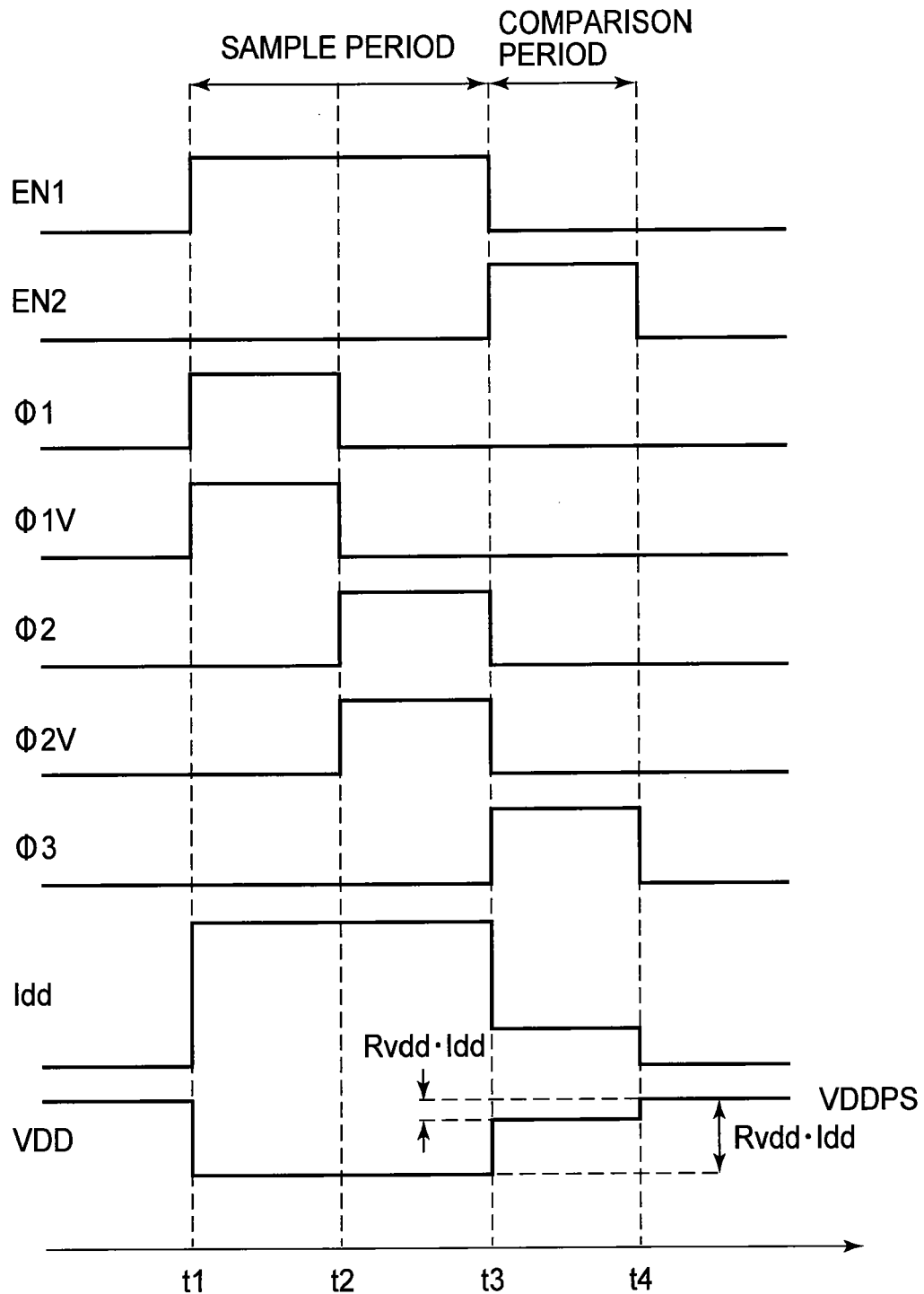
FIG. 3 is a time chart illustrating an operation of the magnetic sensor circuit according to the first embodiment of the present invention.

Next, an operation of the magnetic sensor circuit is described. FIG. 3 is a time chart illustrating the operation of the magnetic sensor circuit according to the first embodiment.

Operation During Period Between Time t1 and Time t2

This period is a sample period in which the Hall voltage generated in the Hall element 25 by the magnetic field applied to the Hall element 25 is amplified and the amplified Hall voltage is sampled. In this case, the control circuit 23 controls the signal EN1 to a high level to control the amplifier circuit 26 to an active state. In addition, the control circuit 23 controls the signal EN2 to a low level to control the comparator circuit 21 to the inactive state. The comparator circuit 21 is disabled, and hence the power consumption of the magnetic sensor circuit is reduced by corresponding power. During this period, the signals $\Phi 1$ and $\Phi 1V$ are in a high level, and hence the switches 1, 4, 6, 7, 11, and 15 are in an on state. In addition, the signals $\Phi 2$ and $\Phi 2V$ are in a low level, and hence the switches 2, 3, 5, 8, and 13 are in an off state.

The signal Φ1 is in the high level and the switches 1 and 4 are in the on state, and hence a bias current flows through the Hall element 25 through the switches 1 and 4. The bias current and a magnetic field cause a Hall voltage between the second terminal and third terminal of the Hall element 25. The signal Φ1V is in the high level and the switches 6 and 7 are in the on state, and hence the Hall voltage is input to the amplifier circuit 26 through the switches 6 and 7. The Hall voltage is amplified by the amplifier circuit 26. The signal Φ1V is in the high level and the switch 11 is in the on state, and hence the amplified Hall voltage charges the capacitor 17 through the switch 11 to be sampled.

The reference voltage circuit 24 generates the reference voltage Vref. The signal Φ1V is in the high level and the switch 15 is in the on state, and hence the reference voltage Vref charges the capacitor 19 through the switch 15 to be sampled.

As illustrated in FIG. 3, a power supply voltage VDD of the magnetic sensor circuit drops from an internal power supply voltage VDDPS of the internal power source 34 to a voltage (VDDPS−Rvdd·Idd) based on a resistance value Rvdd of the internal resistor 33 and a current value Idd of current consumption of the magnetic sensor circuit which is caused by mainly the Hall element 25 and the amplifier circuit 26. Under the dropped power supply voltage (VDD=VDDPS−Rvdd·Idd), the amplified Hall voltage charges the capacitor 17 through the switch 11 to be sampled, and also the reference voltage Vref charges the capacitor 19 through the switch 15 to be sampled. In other words, while power is supplied to mainly the Hall element 25 and the amplifier circuit 26 to drop the power supply voltage VDD, both the amplified Hall voltage and the reference voltage Vref are sampled.

Operation During Period Between Time t2 and Time t3

During this period, the control circuit 23 controls the following operation. The signals Φ1 and Φ1V are in the low level, and hence the switches 1, 4, 6, 7, 11, and 15 are in the off state. In addition, the signals Φ2 and Φ2V are in the high level, and hence the switches 2, 3, 5, 8, and 13 are in the on state.

Then, a path of the bias current flowing through the Hall element 25 is changed from a path between the first terminal and the fourth terminal to a path between the second terminal and the third terminal. A Hall voltage of the Hall element 25 which is generated between the second terminal and the third terminal is generated between the first terminal and the fourth terminal. The capacitor to be charged by the amplified Hall voltage is changed from the capacitor 17 to the capacitor 18.

Operation During Period Between Time t3 and Time t4

This period is a comparison period for comparing a voltage Vh2 based on a magnetic field with the reference voltage Vref. In this case, the control circuit 23 controls the signals Φ1, Φ2, Φ1V, and Φ2V to the low level to control the Hall element 25 to the inactive state. In addition, the control circuit 23 controls the signal EN1 to the low level to control the amplifier circuit 26 to the inactive state. Further, the control circuit 23 controls the signal EN2 to the high level to control the comparator circuit 21 to the active state. The Hall element 25 and the amplifier circuit 26 are disabled, and hence the power consumption of the magnetic sensor circuit is reduced by corresponding power. During this period, the signal Φ3 is in the high level, and hence the switches 12, 14, and 16 are in the on state.

The signal Φ3 is in the high level and the switches 12 and 14 are in the on state, and hence the capacitors 13 and 18 are connected in parallel. Therefore, the respective voltages (amplified Hall voltages), which are sampled and then held in the respective capacitors, are averaged and input as the voltage Vh2 based on the magnetic field to the non-inverting input terminal of the comparator circuit 21. The voltage (reference voltage Vref), which is sampled and then held in the capacitor 19, is input to the inverting input terminal of the comparator circuit 21. The comparator circuit 21 compares the voltage Vh2 which is based on the magnetic field and generated after sampling under a state in which power is supplied to mainly the Hall element 25 and the amplifier circuit 26 to drop the power supply voltage VDD, with the reference voltage Vref after sampling under the same state. In this case, when the voltage Vh2 based on the magnetic field is higher than the reference voltage Vref, an output signal of the comparator circuit 21 and an output voltage VOUT are in the high level. On the other hand, when the voltage Vh2 is lower than the reference voltage Vref, the output signal of the comparator circuit 21 and the output voltage VOUT are in the low level. The output signal of the comparator circuit 21 is buffered by the buffer circuit 22.

In this case, when a magnetoelectric conversion coefficient of the Hall element 25 is denoted by KH, the following Expressions (1) to (3) hold.

$$VDD = VDDPS - Rvdd \cdot Idd \tag{1}$$

$$KH \propto VDD \tag{2}$$

$$Vref \propto VDD \tag{3}$$

From Expression (2), Expression (4) also holds.

$$Vh2 \propto VDD \tag{4}$$

A magnetic detection level Bdet on the detection of a magnetic field applied to the Hall element 25 is expressed by the following Expression (5).

$$Bdet = Vref/KH \tag{5}$$

Therefore, from Expressions (2) to (5), the magnetoelectric conversion coefficient KH is proportional to the dropped power supply voltage VDD, and hence the voltage Vh2 based on the magnetic field is also proportional to the dropped power supply voltage VDD. Both the voltage Vh2 based on the magnetic field and the reference voltage Vref are proportional to the dropped power supply voltage VDD, and hence the magnetic detection level Bdet less depends on the resistance value Rvdd of the internal resistor 33.

Assume that V1 indicates a voltage generated between an output terminal of the first-stage second amplifier 72 and an output terminal of the first-stage first amplifier 71, V2 indicates a voltage generated by chopping the voltage V1 by the chopper circuit 73, V3 indicates a voltage generated at an output terminal of the second-stage amplifier 74, and Vh2 indicates the voltage generated at the non-inverting input terminal of the comparator circuit 21. Assume that G1 indicates a gain of the first amplification stage unit including the first-stage first amplifier 71 and the first-stage second amplifier 72, and G2 indicates a gain of the second amplification stage unit including the second-stage amplifier 74. Assume that Vh1 indicates a Hall voltage. Assume that Voh indicates an offset voltage of the Hall element 25, Voa1 indicates an offset voltage of the first amplification stage unit, and Voa2 indicates an offset voltage of the second amplification stage unit.

During the period between the time t1 and the time t2 (sample period), the voltage V1 is expressed by the following Expression (11).

$$V1=G1\cdot(+Voh+Voa1+Vh1) \quad (11)$$

The voltage V1 is equal to the voltage V2, and hence the voltage V2 is expressed by the following Expression (12).

$$V2=G1\cdot(+Voh+Voa1+Vh1) \quad (12)$$

The voltage V2 is amplified to the voltage V3 by the second amplification stage unit. The voltage V3 is expressed by the following Expression (13).

$$V3=G1\cdot G2(+Voh+Voa1+Vh1)+G2\cdot Voa2 \quad (13)$$

During the period between the time t2 and the time t3 (sample period), the path of the bias current flowing through the Hall element 25 is changed, and hence the voltage V1 is expressed by the following Expression (14).

$$V1=G1\cdot(+Voh+Voa1-Vh1) \quad (14)$$

The voltage V1 is chopped by the chopper circuit 73 to obtain the voltage V2. The voltage V2 is expressed by the following Expression (15).

$$V2=G1\cdot(-Voh-Voa1+Vh1) \quad (15)$$

The voltage V2 is amplified to the voltage V3 by the second amplification stage unit. The voltage V3 is expressed by the following Expression (16).

$$V3=G1\cdot G2(-Voh-Voa1+Vh1)+G2\cdot Voa2 \quad (16)$$

During the period between the time t3 and the time t4 (comparison period), the voltage V3 generated during the period between the time t1 and the time t2 and the voltage V3 generated during the period between the time t2 and the time t3 are averaged to obtain the voltage Vh2. The voltage Vh2 is expressed by the following Expression (17).

$$Vh2=G1\cdot G2\cdot Vh1+G2\cdot Voa2 \quad (17)$$

From Expression (17), the offset voltage Voh of the Hall element 25 and the offset voltage Voa1 of the first amplification stage unit including the first-stage first amplifier 71 and the first-stage second amplifier 72 in the amplifier circuit 26 are not included in the voltage Vh2 based on the magnetic field.

Therefore, the comparator circuit 21 compares the voltage Vh2 which is based on the magnetic field and generated after sampling under the state in which power is supplied to mainly the Hall element 25 and the amplifier circuit 26 to drop the power supply voltage VDD, with the reference voltage Vref after sampling under the same state. Both the voltages are generated based on the power supply voltage VDD dropped by the internal resistor 33. Thus, the magnetic detection level Bdet less depends on the resistance value Rvdd of the internal resistor 33.

The comparator circuit 21 may be disabled during the sample period, and the Hall element 25 and the amplifier circuit 26 may be disabled during the comparison period, and hence the power consumption of the magnetic sensor circuit is reduced by corresponding power.

The offset voltage Voh of the Hall element 25 and the offset voltage Voa1 of the first amplification stage unit including the first-stage first amplifier 71 and the first-stage second amplifier 72 in the amplifier circuit 26 are not included in the voltage Vh2 based on the magnetic field.

In FIG. 1, at the timing when the signal Φ1V becomes the high level, the reference voltage Vref charges the capacitor 19 through the switch 15 to be sampled. Although not illustrated, the reference voltage Vref may be sampled at a timing when the signal Φ2V becomes the high level.

The signals Φ1 and Φ1V may be the same signal.
The signals Φ2 and Φ2V may be the same signal.

FIG. 3 illustrates the case where the comparator circuit 21 is disabled during the sample period and the Hall element 25 and the amplifier circuit 26 are disabled during the comparison period. Although not illustrated, the comparator circuit 21 may operate during the sample period and the Hall element 25 and the amplifier circuit 26 may be disabled during the comparison period. Although not illustrated, the comparator circuit 21 may be disabled during the sample period and the Hall element 25 and the amplifier circuit 26 may operate during the comparison period.

Second Embodiment

Figure 4:
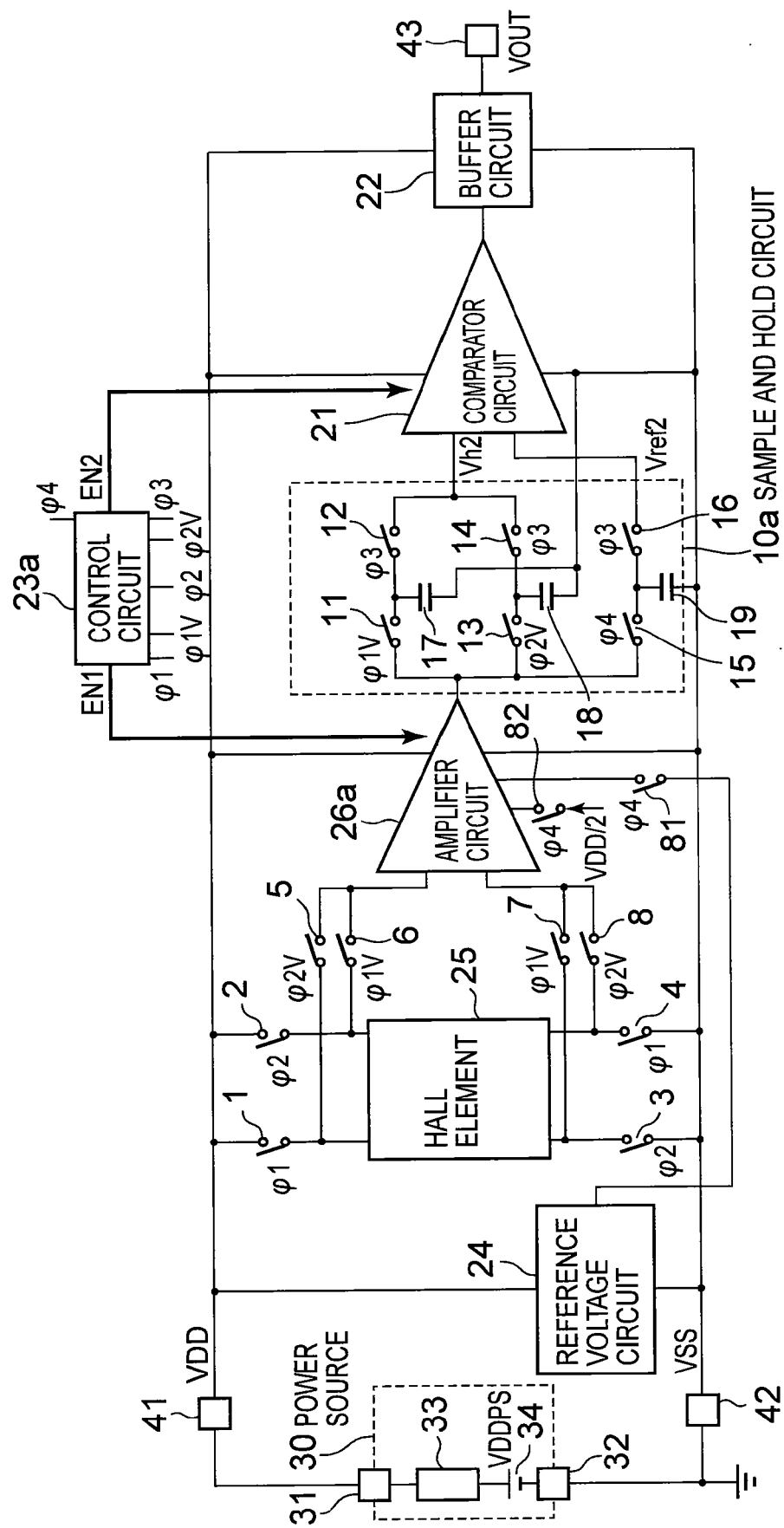
FIG. 4 illustrates a magnetic sensor circuit according to a second embodiment of the present invention.
Figure 5:
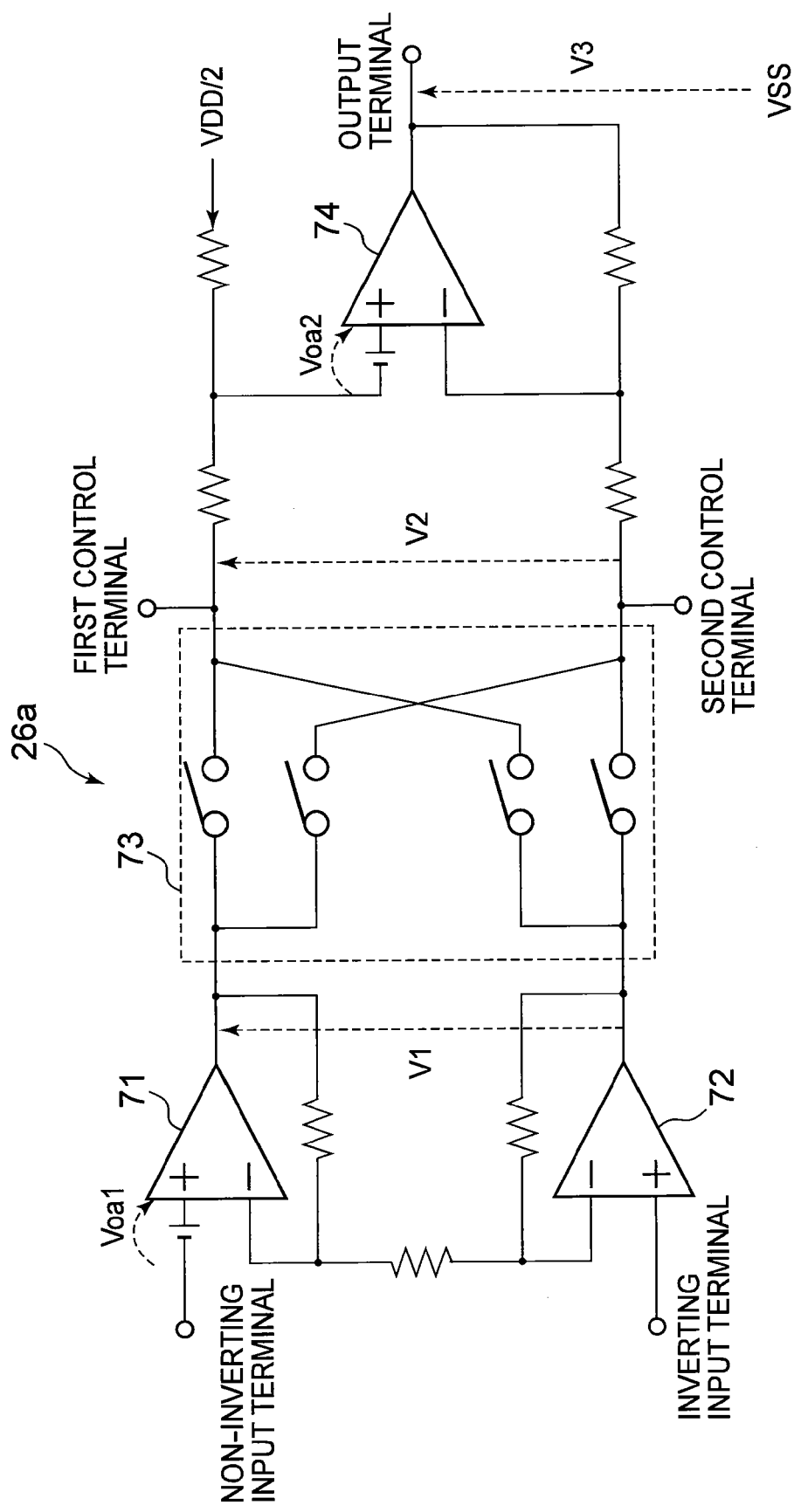
FIG. 5 illustrates an amplifier circuit of the magnetic sensor circuit according to the second embodiment of the present invention.

A structure of a magnetic sensor circuit according to a second embodiment is described. FIG. 4 illustrates the magnetic sensor circuit according to the second embodiment. FIG. 5 illustrates an amplifier circuit of the magnetic sensor circuit according to the second embodiment.

Comparing the second embodiment with the first embodiment, the amplifier circuit 26 is changed to an amplifier circuit 26a. In the amplifier circuit 26a, first and second control terminals are further provided. The sample and hold circuit 10 is changed to a sample and hold circuit 10a. In the sample and hold circuit 10a, the second input terminal is removed. The control circuit 23 is changed to a control circuit 23a. In the control circuit 23a, an output terminal for outputting a signal Φ4 is further provided, and switches 81 and 82 are further provided.

Comparing the second embodiment with the first embodiment, the output terminal of the reference voltage circuit 24 is connected not to the second input terminal of the sample and hold circuit 10 but to the first control terminal of the amplifier circuit 26a through the switch 81. A terminal to which a voltage (VDD/2) is applied is connected to the second control terminal of the amplifier circuit 26a through the switch 82. The switch 15 is provided not at the second input terminal of the sample and hold circuit 10 but at the first input terminal of the sample and hold circuit 10a. The control circuit 23a generates the signal Φ4 to control the switch 15 instead of the signal Φ1V. The control circuit 23a generates the signal Φ4 to control the switches 81 and 82.

The amplifier circuit 26a amplifies the Hall voltage and the reference voltage Vref. The sample and hold circuit 10a samples the amplified Hall voltage and the amplified reference voltage Vref during a sample period. During a comparison period, the comparator circuit 21 compares the Hall voltage with the reference voltage Vref which are amplified and sampled, and outputs an output voltage based on a result obtained by comparison.

Figure 6:
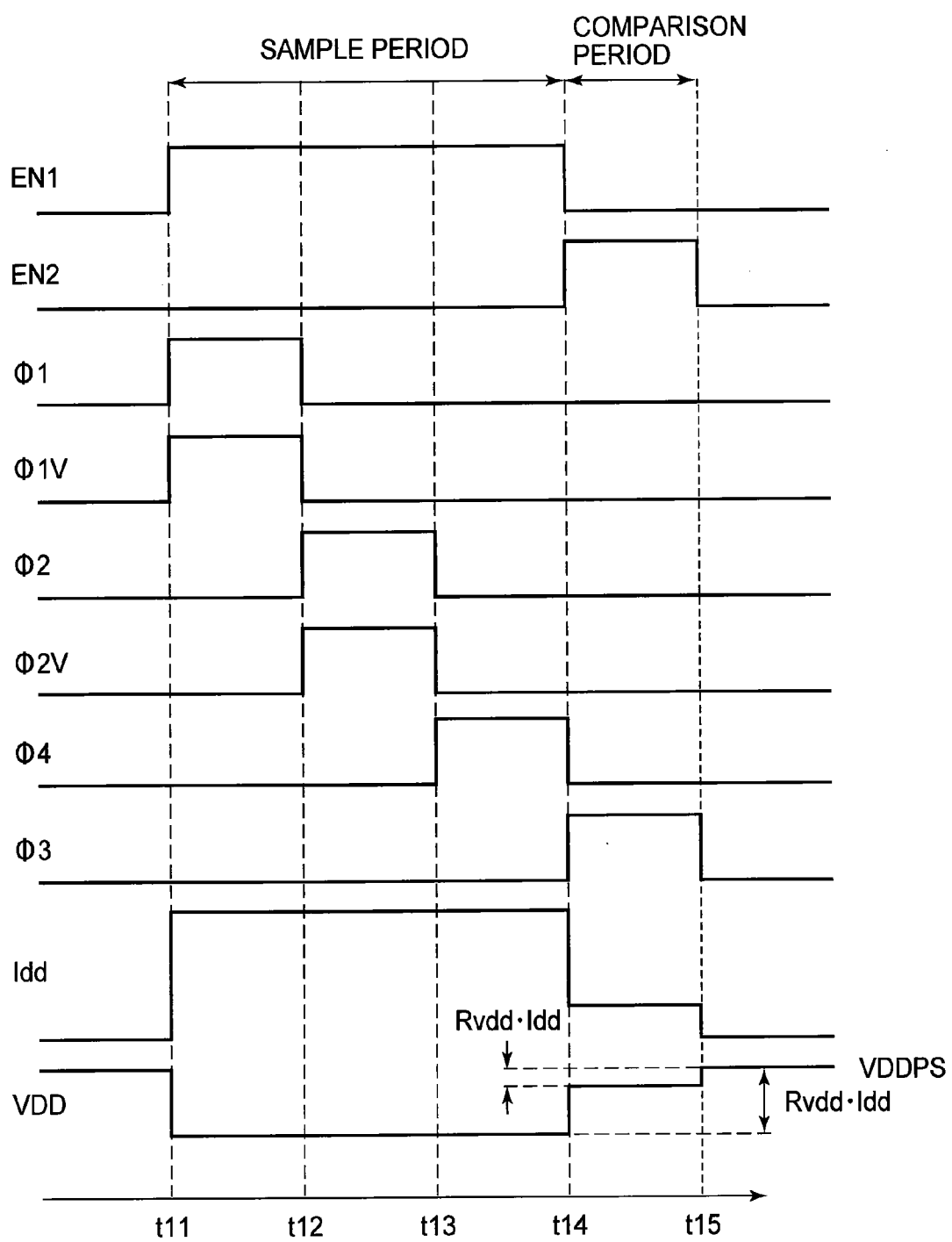
FIG. 6 is a time chart illustrating an operation of the magnetic sensor circuit according to the second embodiment of the present invention.
Figure 7:
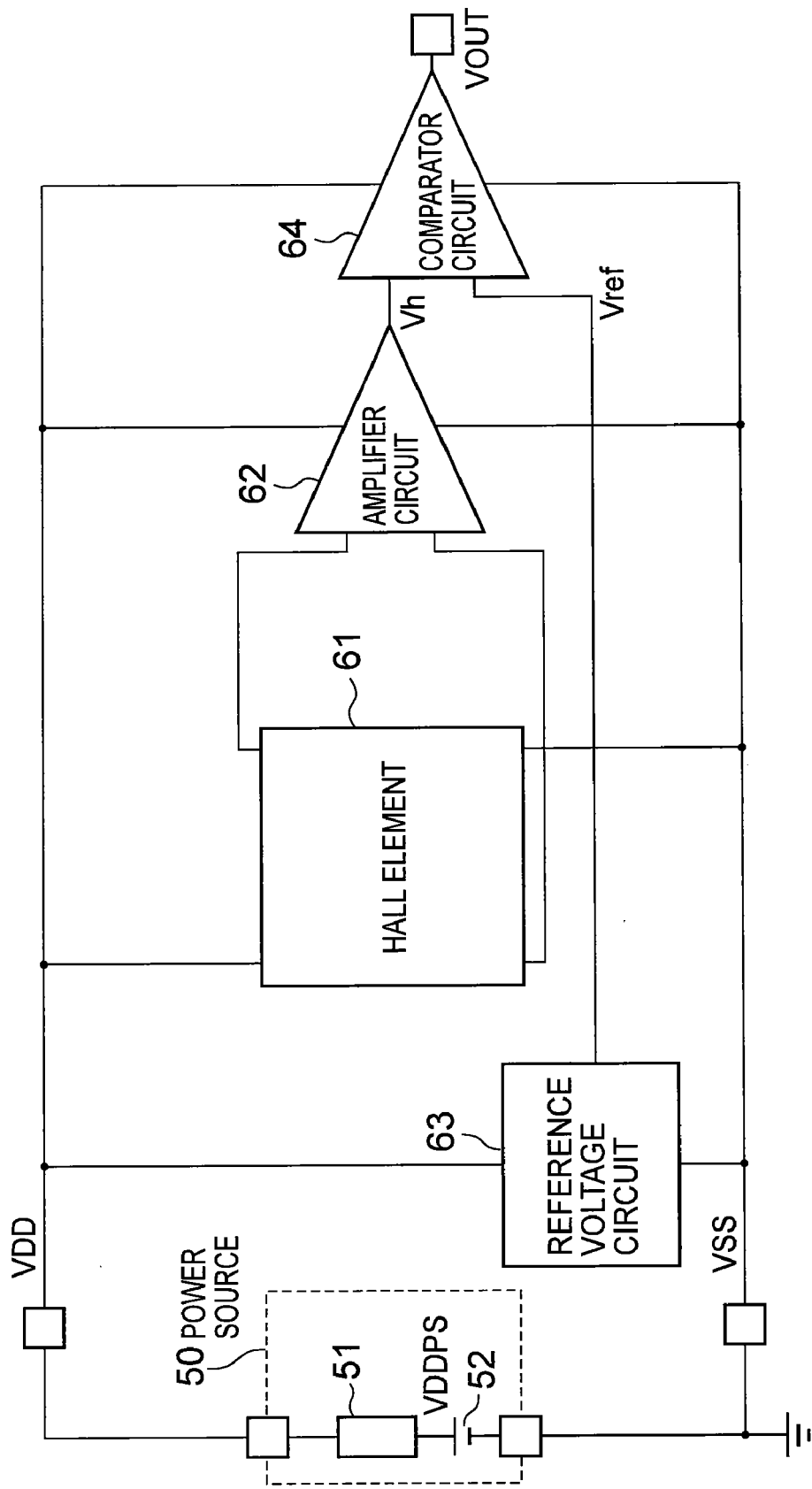
FIG. 7 illustrates a conventional magnetic sensor circuit.

Next, an operation of the magnetic sensor circuit is described. FIG. 6 is a time chart illustrating the operation of the magnetic sensor circuit.

Operation During Period Between Time t11 and Time t12

During this period, the same operation as the operation during the period between the time t1 and the time t2 in the first embodiment is performed.

Operation During Period Between Time t12 and Time t13

During this period, the same operation as the operation during the period between the time t2 and the time t3 in the first embodiment is performed.

Operation During Period Between Time t13 and Time t14

This period is a sample period for amplifying the reference voltage Vref and sampling the amplified reference voltage Vref. In this case, the control circuit 23a controls the signal EN1 to the high level to control the amplifier circuit 26a to the active state. Further, the control circuit 23a controls the signal EN2 to the low level to control the comparator circuit 21 to the inactive state. The comparator circuit 21 is disabled, and hence the power consumption of the magnetic sensor circuit is reduced by corresponding power. During this period, the signal Φ4 is in the high level, and hence the switches 15, 81, and 82 are in the on state. The signals Φ1, Φ2, Φ1V, and Φ2V are in the low level, and hence the switches 1 to 8, 11, and 13 are in the off state. The control circuit 23a controls to turn off respective switches of the chopper circuit 73 illustrated in FIG. 5.

The signal Φ4 is in the high level and thus the switches 81 and 82 are in the on state, and hence the reference voltage Vref is input to the first control terminal of the amplifier circuit 26a and the voltage (VDD/2) is input to the second control terminal thereof. Then, a total of the reference voltage Vref and the offset voltage Voa2 of the second-stage amplifier 74 is amplified with reference to the voltage (VDD/2) to be output as a reference voltage Vref2 which is obtained by amplification. The switches 11 and 13 are in the off state and the switch 15 is in the on state, and hence the reference voltage Vref2 obtained by amplification charges the capacitor 19 through the switch 15 to be sampled.

Operation During Period Between Time t14 and Time t15

During this period, the same operation as the operation during the period between the time t3 and the time t4 in the first embodiment is performed.

Again, as described above, the voltage Vh2 is expressed by the following Expression (17).

$$Vh2 = G1 \cdot G2 \cdot Vh1 + G2 \cdot Voa2 \qquad (17)$$

The second amplification stage unit including the second-stage amplifier 74 amplifies the reference voltage Vref to the reference voltage Vref2. The reference voltage Vref2 obtained by amplification is expressed by the following Expression (18).

$$Vref2 = G2 \cdot Vref + G2 \cdot Voa2 \qquad (18)$$

The voltage Vh2 based on the magnetic field has the voltage (G2·Voa2) and is input to the non-inverting input terminal of the comparator circuit 21. The reference voltage Vref2 obtained by amplification also has the voltage (G2·Voa2) and is input to the inverting input terminal of the comparator circuit 21. Therefore, from Expressions (17) and (18), the offset voltage Voa2 of the second amplification stage unit including the second-stage amplifier 74 in the amplifier circuit 26a does not affect the comparator circuit 21.

In such a case, the comparator circuit 21 is not affected by the offset voltage Voa2 of the second amplification stage unit including the second-stage amplifier 74 in the amplifier circuit 26a, as well as the offset voltage Voh of the Hall element 25 and the offset voltage Voa1 of the first amplification stage unit including the first-stage first amplifier 71 and the first-stage second amplifier 72 in the amplifier circuit 26a.

What is claimed is:

1. A magnetic sensor circuit to be connected to a power source having an internal resistor, comprising:
   a Hall element for generating a Hall voltage based on a magnetic field;
   an amplifier circuit for amplifying the Hall voltage;
   a reference voltage circuit for generating a reference voltage;
   a sample and hold circuit for sampling the amplified Hall voltage and a voltage based on the reference voltage during a sample period;
   a comparator circuit for comparing the sampled and amplified Hall voltage with the sampled voltage based on the reference voltage during a comparison period and generating an output voltage based on a comparison result; and
   a control circuit for controlling at least the Hall element and the amplifier circuit to an active state during the sample period and controlling at least the comparator circuit to an active state during the comparison period.

2. A magnetic sensor circuit according to claim 1, wherein:
   the sample and hold circuit samples the amplified Hall voltage and the reference voltage; and
   the comparator circuit compares the sampled and amplified Hall voltage with the sampled reference voltage.

3. A magnetic sensor circuit according to claim 1, wherein:
   the amplifier circuit amplifies the Hall voltage and the reference voltage;
   the sample and hold circuit samples the amplified Hall voltage and the amplified reference voltage; and
   the comparator circuit compares the sampled and amplified Hall voltage with the sampled and amplified reference voltage.

* * * * *